United States Patent [19]

Morton et al.

[11] Patent Number: 5,343,359

[45] Date of Patent: Aug. 30, 1994

[54] APPARATUS FOR COOLING DAUGHTER BOARDS

[75] Inventors: David M. Morton, Eau Claire; Stephen A. Bowen, Chippewa Falls, both of Wis.

[73] Assignee: Cray Research, Inc., Eagan, Minn.

[21] Appl. No.: 983,086

[22] Filed: Nov. 19, 1992

[51] Int. Cl.$^5$ .............................................. H05K 7/20
[52] U.S. Cl. .................................. 361/707; 174/252; 257/724; 361/784
[58] Field of Search ................. 439/74, 75, 485, 908; 165/80.3, 80.4, 185; 174/16.3, 252; 361/382, 385–389, 410, 412, 413, 414, 778, 784, 785, 790, 792, 689, 704, 707, 709, 711, 720, 722; 257/706, 707, 713, 714, 720, 723, 724

[56] References Cited

U.S. PATENT DOCUMENTS

| | | | |
|---|---|---|---|
| 2,948,518 | 8/1960 | Kraus | 257/313 |
| 3,065,384 | 11/1962 | Sprude | 317/101 |
| 3,070,729 | 12/1962 | Heidler | 317/100 |
| 3,139,559 | 6/1964 | Heidler | 317/101 |
| 3,141,999 | 7/1964 | Schneider | 317/100 |
| 3,198,991 | 8/1965 | Barnett | 317/100 |
| 3,268,772 | 8/1966 | Kamei et al. | 317/100 |
| 3,270,250 | 8/1966 | Davis | 317/100 |
| 3,327,776 | 6/1967 | Butt | 165/80 |
| 3,334,684 | 8/1967 | Roush et al. | 165/47 |
| 3,504,268 | 3/1970 | Hoffman et al. | 321/11 |
| 3,512,582 | 5/1970 | Chu et al. | 165/105 |
| 3,527,989 | 9/1970 | Cuzner et al. | 317/100 |
| 3,586,959 | 6/1971 | Eccles et al. | 321/8 |
| 3,630,273 | 12/1971 | LaHaye et al. | 165/111 |
| 3,631,325 | 12/1971 | Wenz | 317/100 |
| 3,648,113 | 3/1972 | Rathjen et al. | 317/100 |
| 3,774,078 | 11/1973 | Martin | 361/386 |
| 3,812,402 | 5/1974 | Garth | 317/100 |
| 3,865,183 | 2/1975 | Roush | 165/80 |
| 3,904,934 | 9/1975 | Martin | 317/101 |
| 4,120,021 | 10/1978 | Roush | 361/388 |
| 4,204,247 | 5/1980 | Wigley | 361/387 |
| 4,283,754 | 8/1981 | Parks | 361/382 |
| 4,383,270 | 5/1983 | Schelhorn | 357/71 |

(List continued on next page.)

FOREIGN PATENT DOCUMENTS

| | | |
|---|---|---|
| 55578 | 12/1981 | European Pat. Off. . |
| 3545253 | 6/1987 | Fed. Rep. of Germany ...... 361/386 |
| 4105396 | 4/1992 | Japan ................................. 361/386 |

OTHER PUBLICATIONS

G. O. Tiffany, "Integrated Circuit Package and Heat Sink", IBM Technical Disclosure Bulletin, vol. 13, No. 1, Jun. 1970, p. 58.

M. J. Donegan, "Thermal Connection for Circuit Package", IBM Technical Disclosure Bulletin, vol. 13, No. 7, Dec. 1970, p. 2029.

C. S. K. Ng, "Circuit Module Package", IBM Technical Disclosure Bulletin, vol. 21, No. 9, Feb. 1979, p. 3591.

A. P. Mandel et al. "Heat Dissipator Assemblies", IBM Technical Disclosure Bulletin, vol. 8, No. 10, Mar. 1966, pp. 1460, 1461.

Primary Examiner—Gerald P. Tolin
Attorney, Agent, or Firm—Schwegman, Lundberg & Woessner

[57] ABSTRACT

The present invention discloses a method and apparatus for conductively transferring heat away from electrical devices located on daughter boards attached to mother boards. The preferred method involves the steps of conductively transferring heat from each electrical device to a conductive layer located within the daughter board, transferring heat from the conductive layer within the daughter board to a conductive structure located on the surface of the daughter board, and transferring heat from the conductive structure to a cooling surface located on the cold plate. The preferred apparatus includes a mother board, a cold plate adjacent the mother board and attached to the mother board, a daughter board with an electrical device attached thereto, the daughter board attached to the mother board opposite the cold plate. The daughter board lies in a plane which is adjacent and substantially parallel to the plane of the mother board. Also included is conductive heat transfer means for conductively transferring heat energy from the electrical device on the daughter board to the cold plate.

6 Claims, 4 Drawing Sheets

U.S. PATENT DOCUMENTS

| | | | |
|---|---|---|---|
| 4,535,385 | 8/1985 | August et al. | 361/388 |
| 4,551,787 | 11/1985 | Mittal et al. | 361/387 |
| 4,590,538 | 5/1986 | Cray, Jr. | 361/385 |
| 4,628,407 | 12/1986 | August et al. | 361/388 |
| 4,729,061 | 3/1988 | Brown | 361/386 |
| 4,884,168 | 11/1989 | August et al. | 361/382 |
| 4,939,624 | 7/1990 | August et al. | 361/424 |
| 5,014,904 | 5/1991 | Morton | 228/176 |
| 5,130,768 | 7/1992 | Wu | 257/713 |

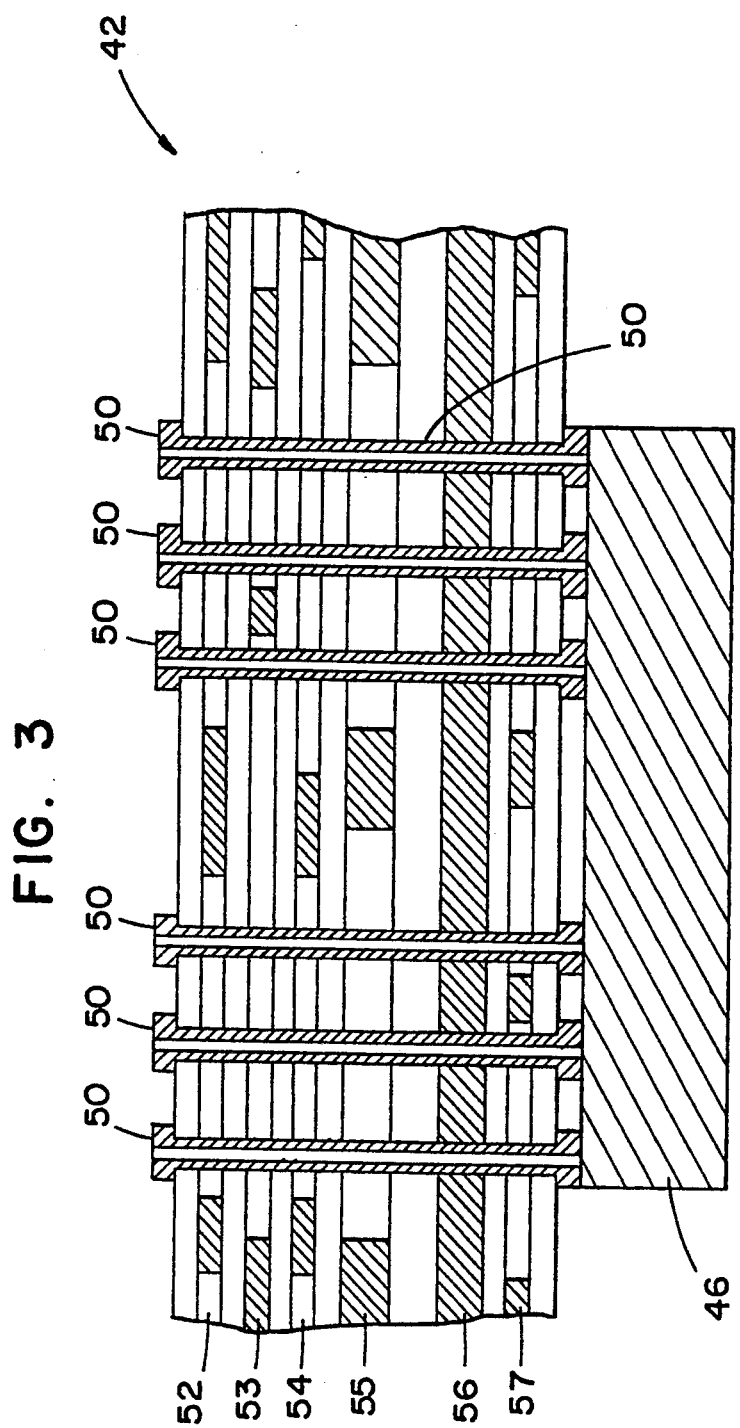

APPARATUS FOR COOLING DAUGHTER BOARDS

BACKGROUND OF THE INVENTION

1. Field of the Invention

The present invention relates generally to a method and apparatus for cooling daughter boards containing electrical devices. More particularly, the present invention relates to a method and apparatus for conductively cooling electrical devices on a daughter board.

2. Description of the Related Art

In the field of high speed computers, high density, high speed electronic devices exhibit above average power consumption characteristics. That power consumption leads to correspondingly high levels of heat generation which must be effectively dissipated to avoid downtime for heat related failures. Any cooling apparatus or method used in conjunction with such high speed computers must be able to efficiently dissipate heat from the electronic devices while minimizing the effect of such heat dissipation on the electrical performance of the devices.

Commonly assigned U.S. Pat. No. 4,884,168 issued on Nov. 28, 1989 to August et al., titled "COOLING PLATE WITH INTERBOARD CONNECTOR APERTURES FOR CIRCUIT BOARD ASSEMBLIES" describes a cooling plate for heat dissipation that is particularly adapted for use with stacks of printed circuit boards. The cooling plate includes apertures and mounting means for Z-axis connector assemblies so that printed circuit boards attached to either side of the cooling plate may be electrically interconnected.

Externally, the cooling plate has a fixed pattern of heat conducted paths that are substantially identical to the pattern of devices on a printed circuit board attached to the cooling plate. As a result, the heat generated by the devices is thermally conducted directly to the cooling plate.

Commonly assigned U.S. Pat. No. 4,628,407 issued Dec. 9, 1986 to August et al., titled "CIRCUIT MODULE WITH ENHANCED HEAT TRANSFER AND DISTRIBUTION" describes a printed circuit board used in a high performance computer. A printed circuit board stack is disclosed which includes a heat conducting plate situated within the stack. The printed circuit boards contain thermally conductive paths from each circuit device mounted on the board and through the printed circuit board to locations in contact with the cooling plate. This system provides adequate heat dissipation properties, but tolerance variations in the thickness of the printed circuit board can affect the thickness of the thermal compound between the thermal connector and the circuit device. Those tolerance variations and resulting variations in thickness of the thermal compound can adversely affect the heat dissipation properties of this apparatus.

Commonly assigned U.S. Pat. No. 5,014,904 to Morton issued on May 14, 1991, and titled "BOARD MOUNTED THERMAL PATH CONNECTOR AND COLD PLATE" describes a method and apparatus to dissipate heat from printed circuit boards and electronic devices mounted on them. The printed circuit boards are provided with apertures which receive thermal conductor pads. The thermal conductor pads are secured in the apertures and integrated circuit devices are attached to one side of the pads while the other side of the pads are in contact with a cooling plate.

All of the above patents disclose cooling systems which are particularly well suited for use with printed circuit boards which lie on a substantially planar cooling plate or other heat sink. As such, conductive cooling paths from the devices producing heat to the cooling plates are easily established.

None of the devices, however, address the need for cooling electrical devices on daughter boards attached to such mother boards through the use of a thermally conductive heat transfer path. As a result, daughter boards having electrical devices are typically cooled using fluid mediums, such as liquid or gas, which convectively transfer heat away from the electrical devices. Convection is commonly described as a combination of fluid mixing and conduction. Forced-air convection (typically used for cooling) is not, however, as effective as pure conduction in the transfer of heat away from an electrical device.

In addition, daughter boards cooled through convection must be spaced apart to allow room for the cooling medium to flow around the daughter boards. As a result, the electrical devices are located at greater than optimum distances from the devices with which they communicate. That additional distance causes corresponding reductions in the speed of the computers as signals must travel further to the electrical devices on the mother boards.

Also, as the spacing between daughter boards increases, so must the distance between mother boards on adjacent cooling plates increase—which also causes reductions in computing speed of the machines.

SUMMARY OF THE INVENTION

To overcome the limitations in the related art as described above, and to overcome other limitations that will become apparent upon reading and understanding the following specification, the present invention discloses an improved method and apparatus for cooling daughter boards using conductive heat transfer paths.

The preferred method of the present invention involves the steps of conductively transferring heat from each electrical device to a conductive layer located within the daughter board, transferring heat from the conductive layer within the daughter board to a conductive structure located on the surface of the daughter board, and transferring heat from the conductive structure to a cooling surface located on the cold plate.

The preferred apparatus for conductively cooling an electrical device attached to a daughter board includes a mother board, a cold plate adjacent the mother board and attached to the mother board, a daughter board with an electrical device attached thereto, the daughter board attached to the mother board opposite the cold plate. The daughter board lies in a plane which is adjacent and substantially parallel to the plane of the mother board. Also included is conductive heat transfer means for conductively transferring heat energy from the electrical device on the daughter board to the cold plate.

The present invention provides improved transfer of heat energy from electrical devices on daughter boards over known methods of cooling daughter boards connected to mother boards. In particular, the heat transfer paths provide highly efficient pure conductive cooling while allowing for shorter connections between the electrical devices on the daughter boards and those devices on the mother boards.

In addition to the improved heat transfer characteristics, the size of the computers is reduced and the speed of the devices is not affected by the length of connection between devices to the degree that it is affected in machines employing convective cooling of daughter boards.

Other advantages of the present invention include the dual nature of the conductive structures formed on the daughter boards. Those structures offer structural stability to the boards as well as offering a means for removing the boards and securing them to the mother boards.

BRIEF DESCRIPTION OF THE DRAWINGS

FIG. 3 is a partial cross-sectional view of the construction of the daughter board of the preferred embodiment of the present invention.

FIG. 4 is a bottom view of a daughter board according to the present invention.

DETAILED DESCRIPTION OF THE PREFERRED EMBODIMENT AND METHOD

In the following detailed description of the preferred embodiment and method, references are made to the accompanying drawings which form a part hereof and in which is shown by way of illustration preferred embodiment and method in which the invention may be practiced. It is to be understood that other embodiments may be utilized and that structural changes may be made without departing from the scope of the present invention.

The present invention discloses an improved method and apparatus for transferring heat from electrical devices located on daughter boards to cold plates adjacent mother boards to which the daughter boards are attached. The daughter boards consist of layered printed circuit boards in which the ground layer of the printed circuit board is used as the primary conductive heat transfer path to transfer heat energy from the electrical devices to conductive members located on the daughter board. The heat is then transferred from the conductive member on the daughter board to cooling surfaces on a cold plate on which a mother board is mounted.

As used in conjunction with the present invention, "conductive" cooling means that substantially all of the heat energy is transferred from one physical body to another by direct contact. Although heat can also be transferred away from an electrical device through convection and radiation, the present invention contemplates providing a primary heat transfer path comprised of conductive cooling paths.

Details regarding the construction of cold plates compatible with the present invention will not be discussed here. The construction of such cold plates can, however, be found in U.S. Pat. No. 4,884,168 issued to August et al. on Nov. 28, 1989; U.S. Pat. No. 4,628,407 to August et al. issued Dec. 9, 1986; and U.S. Pat. No. 5,014,904 to Morton issued May 14, 1991. All of the above issued patents are incorporated herein by reference.

Figure 1:
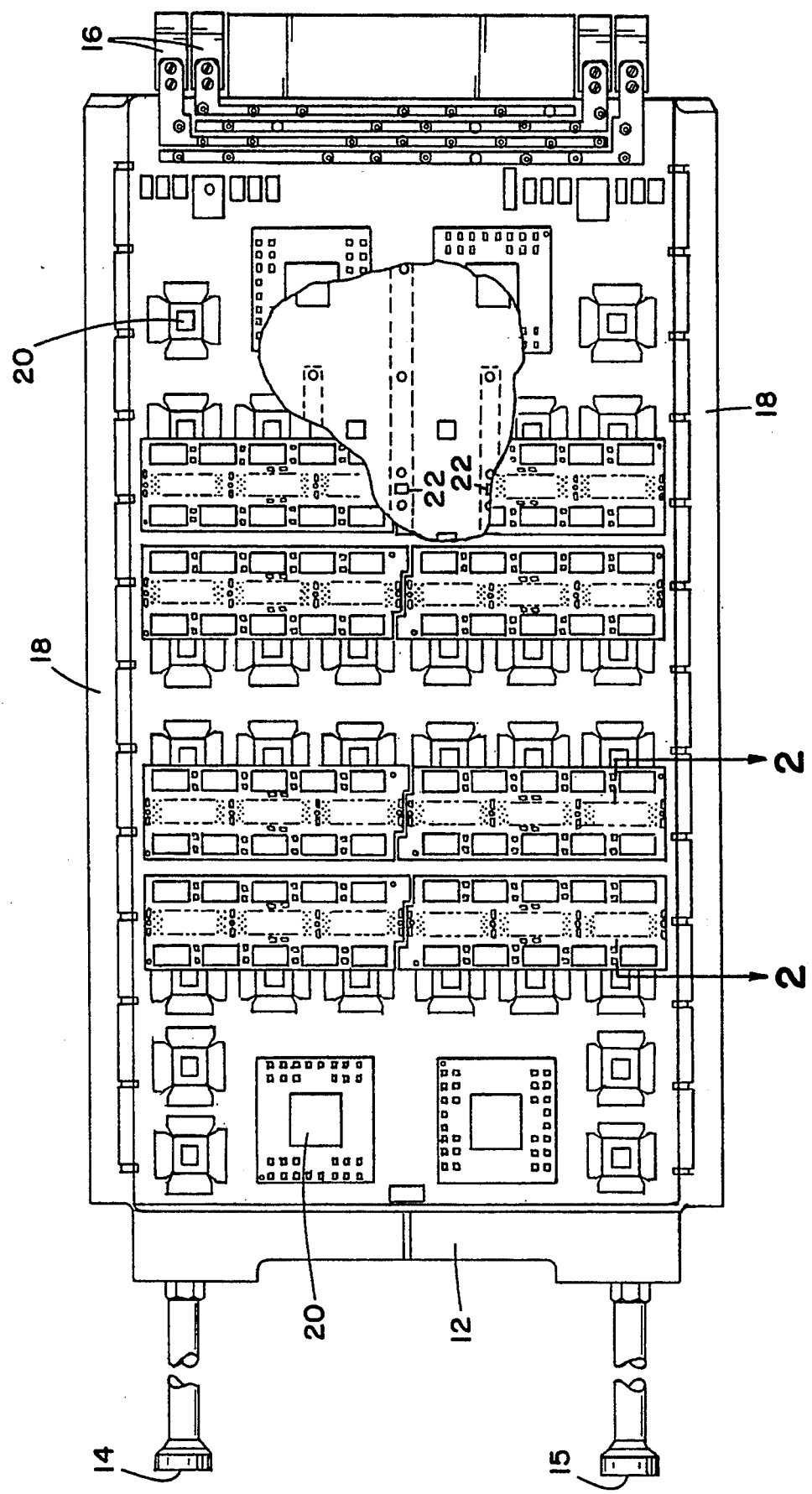
FIG. 1 is a top view, partially cut away, of a cooling apparatus according to the present invention.
Figure 2:
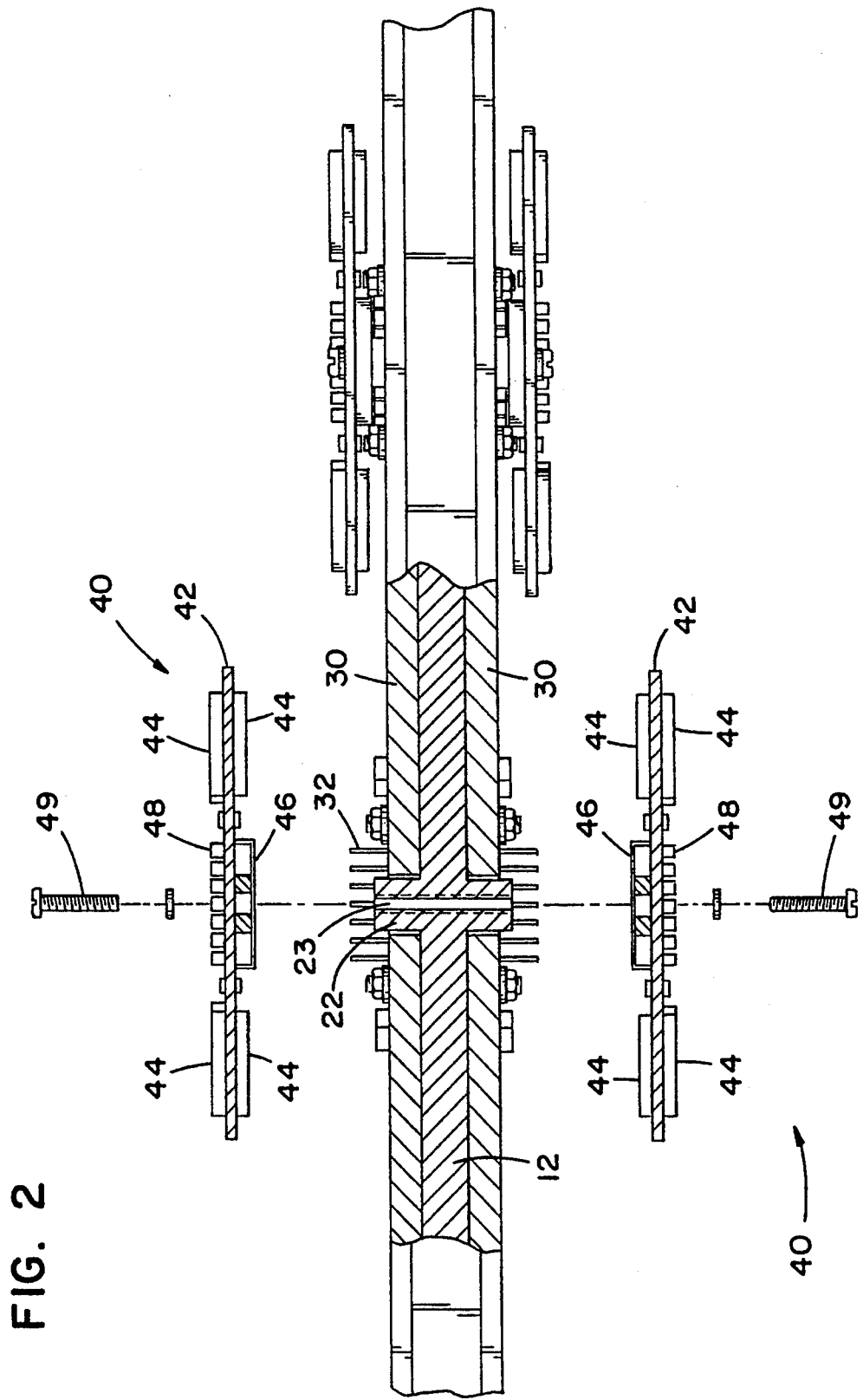
FIG. 2 is a cross-sectional view along lines 2—2 in FIG. 1 with the daughter board removed from the mother board.

Referring now to FIGS. 1 and 2, wherein the apparatus and method as preferred in accordance with the present invention are illustrated. FIG. 1 is a top view of a mother board 30 located on one side of cold plate 12. The preferred cold plate 12 used in the present invention is liquid cooled with liquid flowing through channels formed in the cold plate 12. Inlet 14 and outlet 15 are used to supply cooling fluid to the cold plate 12.

On the opposite end of cold plate 12 and mother board 30 are the preferred power and ground connections 16 which provide power and ground voltage to the mother boards located on cold plate 12. As with the cold plate technology, these connections are disclosed in the above referenced patents and the reader is directed to them for details on their construction. It will also be understood that power and ground could be provided to the mother boards, and connected daughter boards by a wide variety of connectors.

Located along opposing sides of the mother board 30 are signal connection areas 18 in which electric signals from other mother boards or electrical devices are transmitted to and from the integrated circuit chips 20 located on the mother board 30. As with the cold plate construction and power and ground connections, these signal connection areas are well known in the art and details on their construction can be found in the above referenced issued patents as well as many other references. Furthermore, it will be understood that any of a number of signal connection schemes could be used in place of that depicted.

Referring to FIG. 2, which is a cross-sectional view along line 2—2 of the apparatus 10 in FIG. 1, it can be seen that cold plate 12 has a mother board 30 attached to both of its major surfaces. The daughter board assemblies 40 electrically connect to the mother board 30 using pins 32 protruding from the mother board 30. Pins 32 are received in pin sockets 48 located in the board 42 of the daughter board assembly 40.

Cold plate 12 includes cooling bumps 22 which preferably extend through mother boards 30 to provide actual physical connection to conductive structures 46 (referred to as standoff bars 46 below) which are located on each daughter board 42. In the alternative, it will be understood that standoff bars could be enlarged in the vertical dimension to allow direct connection to cold plate 12 in the absence of cooling bumps 22. In that scenario, standoff bars would be in contact with cooling surfaces in place of cooling bumps 22.

As depicted in FIGS. 1 and 2, the daughter board assemblies 40 are preferably physically attached to the cooling bumps 22 with threaded fasteners 49 which cooperate with tapped holes 23 formed in the cooling bumps 22.

Also depicted in FIG. 2, each daughter board assembly 40 includes a plurality of electronic devices 44 located on both of its major sides. In the preferred embodiment, the electrical devices 44 are memory chips for use in conjunction with integrated circuit chips 20 found on mother board 30.

Figure 4:
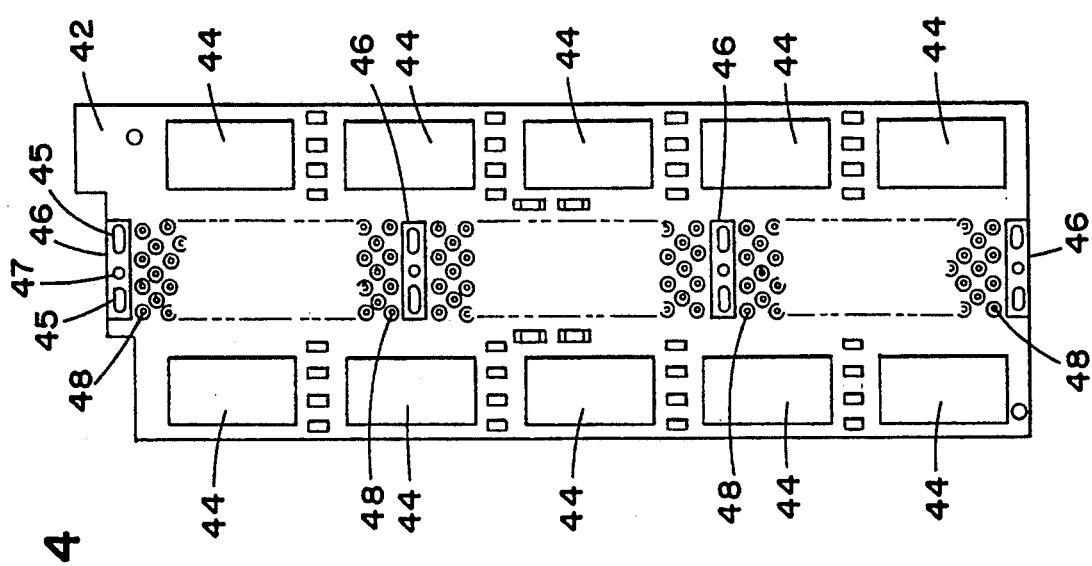
FIG. 4 is an expanded cross-sectional view of the conductive cooling path from the standoffs on the daughter board to the ground layer in the daughter board.

FIG. 4 is a bottom view of the preferred daughter board assembly 40 which includes a plurality of electrical devices 44 attached to the bottom surface of the board 42.

Also attached through the board 42 are pin sockets 48 for receiving pins 32 which extend from the mother board 30. Pin sockets 48 are used to make electrical and ground connections between the electrical devices 44 on the daughter board assembly 40 to the integrated circuit chips 20 on the mother board 30. In the preferred embodiment, pin sockets 48 are arranged in three arrays although any arrangement which provides adequate signal, power and ground connections could be substituted for that depicted. In addition, it will be understood that other means of achieving signal, power and ground connections to the daughter board assemblies 42 could be used in place of those depicted.

Also in the preferred embodiment, daughter board assembly 40 includes four standoff bars 46 attached at substantially evenly spaced intervals to its bottom surface. The standoff bars 46 are preferably comprised of copper although other materials may be substituted. The primary purpose of the standoff bars 46 is to provide a conductive cooling path from the daughter board 42 to the cooling bumps 22 located on cold plate 12.

Standoff bars 46 include an opening 47 for receiving a threaded fastener to attach the daughter board 40 to the mother board 30 as well as slots 45 which are used in removing the daughter board assemblies 40 from the mother boards 30 with an extraction tool (not shown). Although four standoff bars 46 are depicted in FIG. 4, it will be understood that any number of standoff bars 46 could be used with the total number and size varying depending on the amount of heat to be transferred from the daughter board assembly 40 to the cold plate 12.

Figure 5:
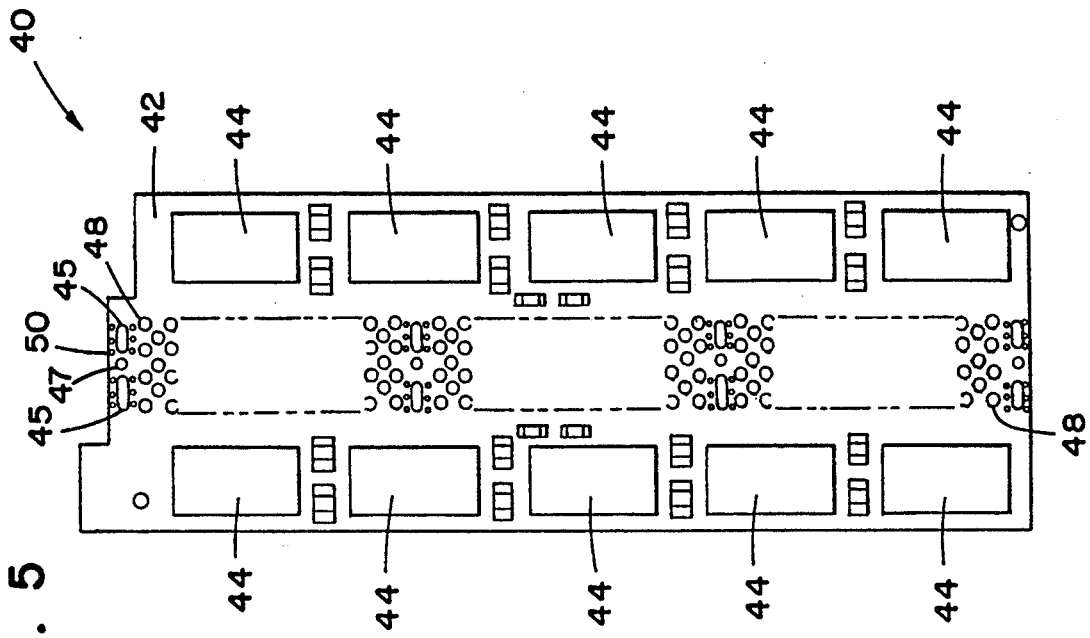
FIG. 5 is a top view of a daughter board according to the present invention.

Turning to FIG. 5, a top view of the daughter board shows a second group of electronic devices 44 attached to this major surface of the daughter board 40. Also depicted in FIG. 5 are the ends of pin sockets 48 which protrude through the daughter board 42 in the preferred embodiment.

Openings 47 in the standoff bars 46 also extend through the board 42 and are used to receive the threaded fasteners 49 which attach the daughter board assembly 40 to the cold plate 12. Extraction slots 45 also extend through the daughter board 42 to receive the extraction tool (not shown).

Also depicted in FIG. 5 are vias 50 which are disposed around the perimeter of standoff bars 46. It will be understood that these vias 50 cannot be seen in the bottom view as they obscured by the standoff bars 46. Vias 50 are used to provide a conductive cooling path from the ground layer in the board 42 to the standoff bars 46.

Referring now to FIG. 3 where a cross-sectional view of a portion of a daughter board 42 and standoff 46 is shown. In the preferred embodiment of the daughter board 42, a series of eight pad, signal, power and ground layers are separated by alternating layers of a dielectric material. These multi-layer circuit board constructions are well known to those of ordinary skill in the art and will not be further described herein.

In the preferred embodiment, layers 55 and 56 are preferably used to carry power and ground, respectively, throughout the daughter board 42. Layer 56 in particular is used to carry the ground voltage and is oversized for its electrical characteristics. It is, however, sized to accommodate the heat which must be transferred from the electrical devices 44 on the daughter board assembly 40 to the standoff bar 46.

In the preferred embodiment, the power and ground layers 55 and 56 are constructed of 2 ounce copper (0.0028 inches or $7.1 \times 10^{-5}$ m. thick) while the pad and signal layers 52, 53, 54, 57 and 58 are constructed of 1 ounce copper (0.0014 inches or $3.6 \times 10^{-5}$ m. thick).

In the preferred embodiment, each of the electrical devices 44 is in connection with the ground layer 56 through vias (not shown) which conduct heat from the electrical devices 44 to the ground layer 56. Ground layer is, in turn, in conductive communication with standoff bar 46 through pads formed at the ends of vias 50 on the bottom surface of the daughter board 42.

As a result, when the daughter board assembly 40 is in place on mother board 30 and cold plate 12, the heat generated by electrical devices 44 is conducted to the ground layer 56, from ground layer 56 to vias 50, through vias 50 to the standoff bars 46, and from the standoff bars 46 to the cooling bumps 22 in cold plate 12. After the heat has been conducted to cold plate 12, it is transferred to the cooling fluid flowing through the board 12 via inlet 14 and outlet 15.

In addition to the ground layer 56 and vias 50, each of the additional signal layers and power layer also serve to distribute heat away from the electrical devices 44 on board 42. In that respect, the heat can also reach the ground layer 56 and standoff bars 46 for eventual transmission to the cold plate 12. The primary heat transfer path is, however, through the path described in detail above.

Although a specific embodiment and method have been illustrated and described herein, it will be appreciated by those of ordinary skill in the art that any arrangement which is calculated to achieve the same purpose may be substituted for the specific embodiment and method shown. This application is intended to cover any adaptations or variations of the present invention and it is intended that the invention be limited only by the claims and the equivalents thereof.

I claim:

1. An apparatus for conductively cooling an electrical devices attached to a daughterboard which is electrically connected to a motherboard, said apparatus comprising:
    a) a motherboard having first and second sides, said second side having a plurality of electrical devices attached thereto, said motherboard further comprising a plurality of apertures formed through said first and second sides;
    b) a cold plate adjacent said first side of said motherboard and attached thereto said plurality of apertures in said motherboard exposing a portion of said cold plate;
    c) a daughterboard having first and second sides, each of first and second sides having an electrical device attached thereto, said first side of said daughterboard adjacent and substantially parallel to said second side of said motherboard, said electrical device attached to said first side of said daughterboard being removed from direct contact with said motherboard and said cold plate; and
    d) conductive heat transfer means for conductively transferring heat energy from said electrical devices on said daughterboard sides to said cold plate through said daughterboard, said conductive heat transfer means comprising a metallic conductive structure located on said first side of said daughterboard, said conductive structure in conductive communication with said cold plate through said plurality of apertures in said motherboard.

2. The apparatus of claim 1, wherein said conductive heat transfer means further comprises a layer of conductive material located within said daughter board, said layer being conductively connected to each said electrical device.

3. The apparatus of claim 2, wherein said conductive heat transfer means further comprises a first via in said daughter board, said first via in conductive contact with each said electrical device and said layer of conductive material.

4. The apparatus of claim 1, wherein said conductive heat transfer means further comprises a second via in said daughter board, said second via in conductive contact with said conductive structure and said layer of conductive material.

5. The apparatus of claim 1, wherein said conductive heat transfer means further comprises a cooling surface on said cold plate adapted to transfer heat from said conductive structure to said cold plate.

6. An apparatus for conductively cooling an electrical devices attached to a daughterboard which is electrically connected to a motherboard, said apparatus comprising:

a) a motherboard having first and second sides, said second side having a plurality of electrical devices attached thereto, said motherboard further comprising a plurality of apertures formed through said first and second sides;

b) a cold plate adjacent said first side of said motherboard and attached thereto, said plurality of apertures in said motherboard exposing a portion of said cold plate;

c) a daughterboard having first and second sides, each of said first and second sides having an electrical device attached thereto, said first side of said daughterboard adjacent and substantially parallel to said second side of said motherboard, said electrical device attached to said first side of said daughterboard being removed from direct contact with said motherboard and said cold plate; and d) conductive heat transfer means for conductively transferring heat energy from said electrical devices on said daughterboard sides to said cold plate through said daughterboard, said conductive heat transfer means further comprising:

1) a layer of metallic conductive material located within said daughterboard, said layer being conductively connected to said electrical devices; and 2) a metallic conductive structure located on said first side of said daughterboard, said conductive structure in conductive communication with said layer of conductive material and with said cold plate through said plurality of apertures in said motherboard.

* * * * *